United States Patent
Liu et al.

(10) Patent No.: US 9,035,671 B2
(45) Date of Patent: May 19, 2015

(54) PROBE CARD AND METHOD FOR TESTING MAGNETIC SENSORS

(75) Inventors: Lianjun Liu, Chandler, AZ (US); Phillip Mather, Phoenix, AZ (US)

(73) Assignee: EVERSPIN TECHNOLOGIES, INC., Chandler, AZ (US)

( * ) Notice: Subject to any disclaimer, the term of this patent is extended or adjusted under 35 U.S.C. 154(b) by 254 days.

(21) Appl. No.: 13/529,065

(22) Filed: Jun. 21, 2012

(65) Prior Publication Data
US 2013/0009659 A1  Jan. 10, 2013

Related U.S. Application Data

(60) Provisional application No. 61/505,015, filed on Jul. 6, 2011.

(51) Int. Cl.
| | | |
|---|---|---|
| *G01R 1/00* | (2006.01) | |
| *G01R 35/00* | (2006.01) | |
| *G01R 33/00* | (2006.01) | |
| *G01R 33/09* | (2006.01) | |

(52) U.S. Cl.
CPC ............ *G01R 35/00* (2013.01); *G01R 33/0035* (2013.01); *G01R 33/09* (2013.01)

(58) Field of Classification Search
USPC ........ 324/756, 318, 202, 307, 756.02, 756.03
See application file for complete search history.

(56) References Cited

U.S. PATENT DOCUMENTS

| | | |
|---|---|---|
| 3,793,468 A | 2/1974 | Akers |
| 5,486,770 A | 1/1996 | Johnson |
| 6,188,219 B1 | 2/2001 | Reeder et al. |
| 7,165,197 B2 | 1/2007 | Park et al. |
| 7,183,763 B1 | 2/2007 | Murata |
| 7,345,470 B2 | 3/2008 | Suzuki |
| 2004/0212366 A1 | 10/2004 | Molyneaux et al. |
| 2008/0106257 A1 | 5/2008 | Suzuki |
| 2009/0146658 A1 | 6/2009 | McDowell et al. |

OTHER PUBLICATIONS

The International Bureau of WIPO, International Preliminary Report on Patentability for International Application No. PCT/US2012/045739, mailed Jan. 16, 2014.
US Patent Office, International Searching Authority, "International Search Report" mailed Oct. 1, 2012; International Appln. No. PCT/US2012/045739, filed Jul. 6, 2012.

*Primary Examiner* — Vincent Q Nguyen
(74) *Attorney, Agent, or Firm* — Bookoff McAndrews, PLLC

(57) ABSTRACT

A probe card and method are provided for testing magnetic sensors at the wafer level. The probe card has one or more probe tips having a first pair of solenoid coils in parallel configuration on first opposed sides of each probe tip to supply a magnetic field in a first (X) direction, a second pair of solenoid coils in parallel configuration on second opposed sides of each probe tip to supply a magnetic field in a second (Y) direction orthogonal to the first direction, and an optional third solenoid coil enclosing or inscribing the first and second pair to supply a magnetic field in a third direction (Z) orthogonal to both the first and second directions. The first pair, second pair, and third coil are each symmetrical with a point on the probe tip array, the point being aligned with and positioned close to a magnetic sensor during test.

20 Claims, 7 Drawing Sheets

PROBE CARD AND METHOD FOR TESTING MAGNETIC SENSORS

TECHNICAL FIELD

The exemplary embodiments described herein generally relate to magnetic sensors and more particularly to a probe card and a method for testing integrated magnetic sensors.

BACKGROUND

Sensors are widely used in modern systems to measure or detect physical parameters, such as direction, position, motion, force, acceleration, temperature, and pressure. While a variety of different sensor types exist for measuring these and other parameters, they all suffer from various limitations. For example, inexpensive low field sensors, such as those used in an electronic compass and other similar magnetic sensing applications, may comprise anisotropic magnetoresistance (AMR) based devices. In order to arrive at the required sensitivity and reasonable resistances that mesh well with complementary metal-oxide semiconductors (CMOS), the chip area of such sensors are generally in the order of square millimeters in size. Furthermore, large set-reset pulses from bulky coils of approximately 500 mA are typically required. For mobile applications, such AMR sensor configurations are costly in terms of expense, circuit area, and power consumption.

Other types of sensors, such as magnetic tunnel junction (MTJ) sensors, giant magnetoresistance (GMR) sensors, and the widely used Hall effect sensors have been used to provide smaller profile sensors, but such sensors have their own concerns, such as inadequate sensitivity and the temperature dependence of their magnetic field response. To address these concerns, MTJ, GMR, and AMR sensors have been employed in a Wheatstone bridge structure to increase sensitivity and to reduce the temperature dependent resistance changes. Hall effect sensors have recently become competitive in this type of application through the development of high sensitivity silicon (Si) based sensors coupled with a thick nickel iron (NiFe) magneto-concentrator for amplification of the local magnetic field. These Hall effect devices typically employ the current spinning technique for optimal temperature response, resulting in a larger than desired CMOS footprint for the circuitry associated with the multiplexing between the various tap point functionality. For minimal sensor size, cost and high performance, MTJ sense elements are preferred.

As a result of the manufacturing process variations, low field Wheatstone bridge based magnetic sensors may exhibit a small yet variable residual offset. Temperature shifts, mechanical stress, and the aging of the device may cause small changes in this offset. Furthermore, conventional magnetic sensors have a sensitivity built into the device by factors such as sense layer thickness, shape, and flux concentrator geometry. Therefore, small variations in the manufacturing process may create variations in the sensor parameters and therefore create a need for the magnetic sensors be tested and calibrated for optimal performance.

Wafer probe cards provide the ability to sort good and bad devices at wafer level to avoid the additional expense of continuing the test and assembly process to a later stage before identifying a poorly performing device. By using printed circuit board probe cards, manufacturers obtain electrical data from the IC devices prior to separating, bonding, and packaging each IC device on the wafer. This data permits a manufacturer to monitor the manufacturing process, to respond to processing problems, and to make process adjustments before incurring additional manufacturing costs. Additionally, other ICs in a multichip module that may be paired with a bad device can be preserved for assembly in packages where all devices are known to be good, instead of requiring other good IC's to be disposed of along with the single poorly performing IC.

Testing of three axis magnetic sensors requires a probe card to supply uniform and adjustable magnetic fields in all three directions at the probe tip locations where the magnetic sensors are to be tested. Some known probe card designs use a spiral coil embedded on a printed circuit board to supply magnetic fields; however, these designs have non-uniform fields at the location of the magnetic sensor devices. The probe card geometry is challenging as no parts of the magnetic coil system may penetrate the plane of the wafer, so the well known Helmholtz geometry for high spatial uniformity is not available. A large uniformity is desirable as it allows greater degrees of parallelism in measurement, i.e., the same or very similar field may be applied to multiple devices. Another desirable feature in the design of the coil set for a probe card is lack of a ferromagnetic core as such cores generally have some remanence, resulting in a residual field imposed on the device after a field excursion, and rendering assessment of the sensors hysteresis behavior difficult.

Accordingly, it is desirable to provide an inexpensive low field sensor probe card for testing integrated magnetic sensors. Furthermore, other desirable features and characteristics of the exemplary embodiments will become apparent from the subsequent detailed description and the appended claims, taken in conjunction with the accompanying drawings and the foregoing technical field and background.

BRIEF SUMMARY

An inexpensive low field sensor probe card is provided for testing integrated magnetic sensors.

A first exemplary embodiment of the probe card comprises a probe ring having a plurality of probe tips configured to be applied to a plurality of input nodes and a plurality of output nodes. First and second solenoid coils in a non-coaxial arrangement at first and second opposed sides of the probe ring are configured to create a first and a second magnetic field, respectively; and third and fourth solenoid coils in a non-coaxial arrangement at third and fourth opposed sides of the probe ring are configured to create a third and a fourth magnetic field, respectively, the third and fourth magnetic fields being orthogonal to the first and second magnetic fields.

A second exemplary embodiment comprises a plurality of electrical contacts configured to be applied to input and output nodes; first and second solenoid coils in a non-coaxial arrangement at first and second opposed sides of the probe ring and configured to create a first and a second magnetic field, respectively; and third and fourth solenoid coils in a non-coaxial arrangement at third and fourth opposed side of the probe ring and configured to create a third and a fourth magnetic field, respectively, the third and fourth magnetic fields being orthogonal to the first and second magnetic fields.

A third exemplary embodiment comprises a method of testing a magnetic sensor with a probe card including a plurality of probe tips and first and second pairs of non-coaxial coils, comprising applying a first magnetic field to the magnetic sensor with the first pair of non-coaxial coils positioned on first opposed sides of the probe tip; sensing an output from the magnetic sensor; applying a second magnetic field with the second pair of non-coaxial coils positioned on second opposed sides of the probe tip, the second magnetic field being orthogonal to the first magnetic field at the magnetic sensor; and sensing an output from the magnetic sensor.

BRIEF DESCRIPTION OF THE DRAWINGS

The present invention will hereinafter be described in conjunction with the following drawing figures, wherein like numerals denote like elements, and.

DETAILED DESCRIPTION

The following detailed description is merely illustrative in nature and is not intended to limit the embodiments of the subject matter or the application and uses of such embodiments. Any implementation described herein as exemplary is not necessarily to be construed as preferred or advantageous over other implementations. Furthermore, there is no intention to be bound by any expressed or implied theory presented in the preceding technical field, background, brief summary, or the following detailed description.

A probe card is provided including a probe ring carrying one or more probe tips having a first pair of solenoid coils in parallel configuration on first opposed sides of the probe tip to supply a magnetic field in a first (X) direction, a second pair of solenoid coils in parallel configuration on second opposed sides of the probe tip to supply a magnetic field in a second (Y) direction orthogonal to the first direction, and optionally a third solenoid coil enclosing the first and second pair to supply a magnetic field in a third direction (Z) orthogonal to both the first and second directions. An alternate embodiment comprises the third solenoid coil inscribed within the first and second pair. The first pair, second pair, and third coils are each about symmetrical with a point on the probe tip, the point being aligned with and positioned close to a sensor during test.

A magnetic field is provided for all three axes (X, Y, Z) with excellent uniformity. Magnetic remanence is avoided by not using magnetic materials in the vicinity of the coils or the device under test (DUT) on the PCB or in the probe structure, and avoiding a ferromagnetic core in the coils.

During the course of this description, like numbers are used to identify like elements according to the different figures that illustrate the various exemplary embodiments.

Figure 1:
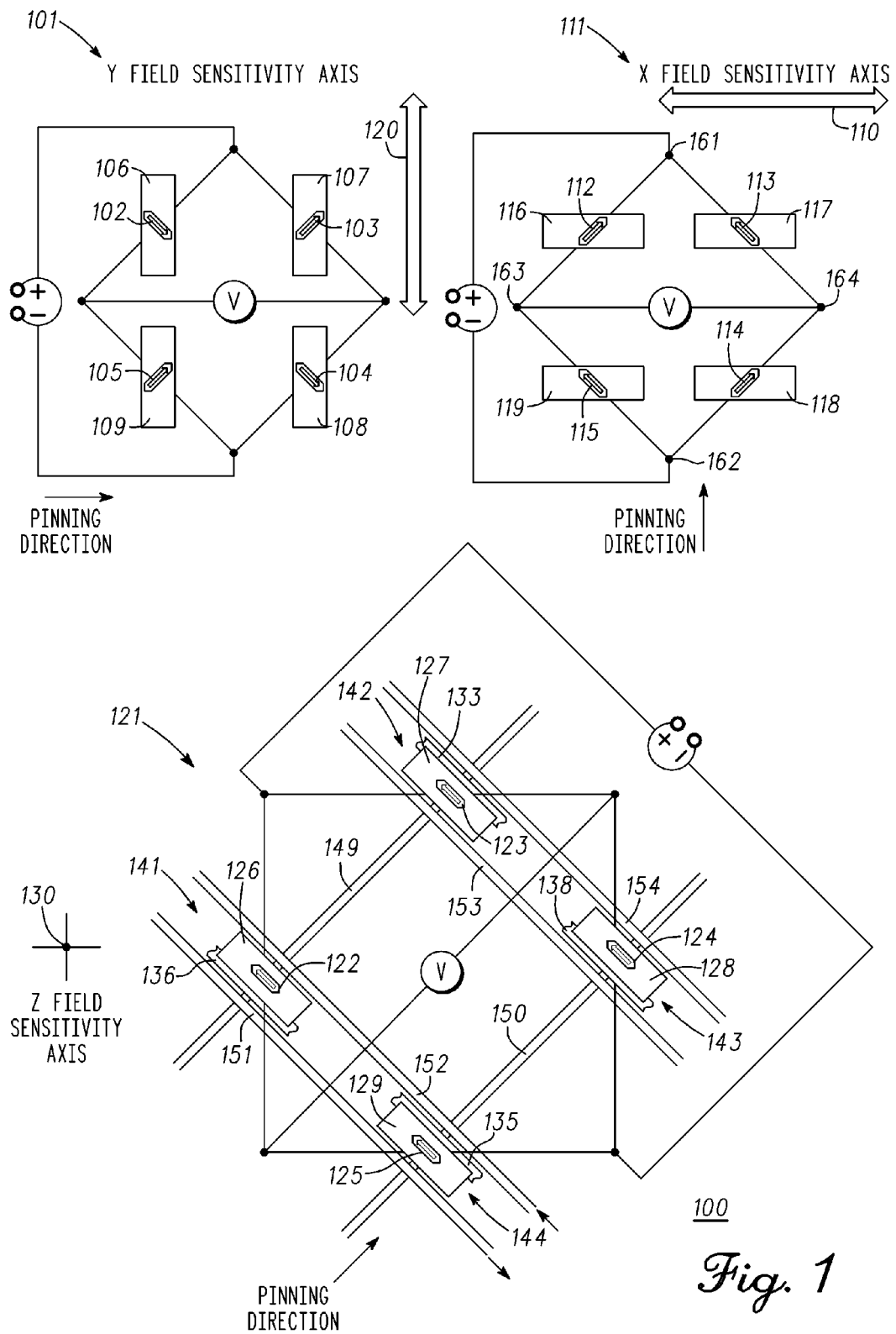
FIG. 1 illustrates an electronic compass structure which uses differential sensors formed from three bridge structures with MTJ sensors.
Figure 2:
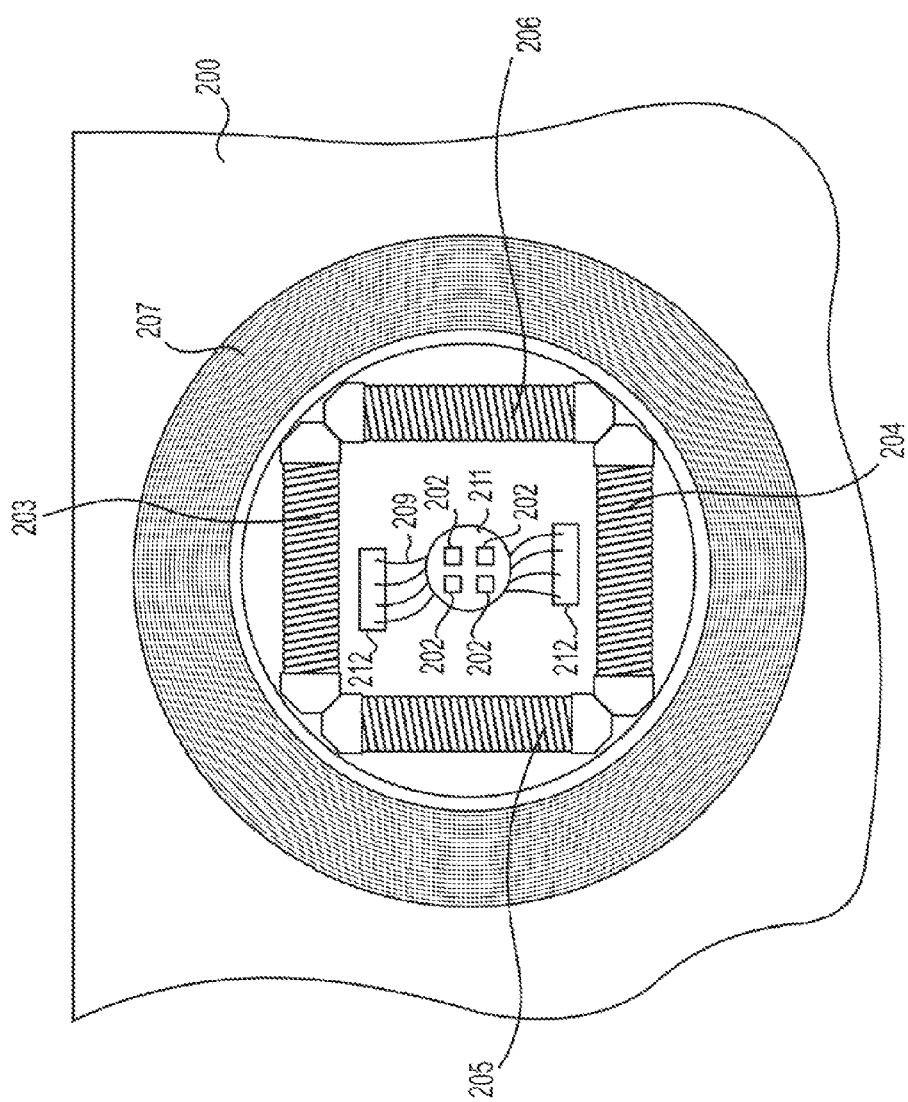
FIG. 2 is a top view of a probe board in accordance with an exemplary embodiment.

It should be noted that all components of this exemplary embodiment as illustrated in FIG. 2 that are similar to components of the exemplary embodiment of FIG. 1 are designated with like numbers.

While magnetic tunnel junction sensors are described herein, any type of magnetic sensor may be tested in accordance with the apparatus and method described herein. FIG. 1 shows such an exemplary magnetic field sensor 100 formed with first, second, and third differential sensors 101, 111, 121 for detecting the component directions of an applied field along a first axis 120 (e.g., the y-axis direction), a second axis 110 (e.g., the x-axis direction), and a third axis 130 (e.g., the z-axis direction), respectively. The z-axis direction is represented as a dot and cross-hairs as going either into or out of the page on which FIG. 1 is situated. Exemplary embodiments of the first and second sensors 101, 111 are described in detail in U.S. patent application Ser. No. 12/433,679. As depicted herein, each sensor 101, 111, 121 is formed with unshielded sense elements that are connected in a bridge configuration. Thus, the first sensor 101 is formed from the connection of a plurality of sense elements 102-105 in a bridge configuration over a corresponding plurality of pinned layers 106-109, where each of the pinned layers 106-109 is magnetized in the x-axis direction. In similar fashion, the second sensor 111 is formed from the connection of a plurality of sense elements 112-115 in a bridge configuration over a corresponding plurality of pinned layers 116-119 that are each magnetized in the y-axis direction that is perpendicular to the magnetization direction of the pinned layers 106-109. Furthermore, the third sensor 121 in the same plane as the first and second sensors 101, 111 is formed from the connection of a plurality of sense elements 122-125 in a bridge configuration over a corresponding plurality of pinned layers 126-129 that are each magnetized in an arbitrary in-plane direction that may be at any angle to the magnetization directions of the pinned layers 106-109 and 116-119. In the depicted bridge configuration 101, the sense elements 102, 104 are formed to have a first easy axis magnetization direction and the sense elements 103, 105 are formed to have a second easy axis magnetization direction, where the first and second easy axis magnetization directions are orthogonal with respect to one another and are oriented to differ equally from the magnetization direction of the pinned layers 106-109. As for the second bridge configuration 111, the sense elements 112, 114 have a first easy axis magnetization direction that is orthogonal to the second easy axis magnetization direction for the sense elements 113, 115 so that the first and second easy axis magnetization directions are oriented to differ equally from the magnetization direction of the pinned layers 116-119. In the third bridge configuration 121, the sense elements 122, 123, 124, and 125 all have an easy axis magnetization direction that is orthogonal to the pinned magnetization direction of the pinned layers 126, 127, 128, and 129. The third bridge configuration 121 further includes flux guides 133, 135 positioned adjacent to the right edge of sense elements 123, 125, and flux guides 136, 138 positioned adjacent to the left edge of sense elements 122, 124, respectively. Flux guides 133, 135, 136, and 138 are positioned below sense elements 122-125. The positioning of these flux guides 133, 135, 136, and 138 is subsequently described in more detail in FIG. 2. In the depicted sensors 101, 111, 121 there is no shielding required for the sense elements, nor are any special reference elements required. In an exemplary embodiment, this is achieved by referencing each active sense element (e.g., 102, 104) with another active sense element (e.g., 103, 105) using conventional shape anisotropy techniques to establish the easy magnetic axes of the referenced sense elements to be deflected from each other by 90 degrees for the x and y sensors, and referencing a sense element that responds in an opposite manner to an applied field in the Z direction for the Z sensor. The Z sensor referencing will be described in more detail below. The configuration shown in FIG. 1 is not required to harvest the benefits of the third sensor 121 structure described in more detail in FIG. 2, and is only given as an example.

By positioning the first and second sensors 101, 111 to be orthogonally aligned, each with the sense element orientations deflected equally from the sensor's pinning direction and orthogonal to one another in each sensor, the sensors can detect the component directions of an applied field along the first and second axes. Flux guides 133, 135, 136, 138 are positioned in sensor 121 below the opposite edges of the elements 122-125, in an asymmetrical manner between legs 141, 143 and legs 142, 144. As flux guides 136, 138 are placed below the sense elements 122, 124, the magnetic flux from the Z field may be guided into the XY plane along the left side and cause the magnetization of sense elements 122 and 124 to rotate in a first direction towards a higher resistance. Similarly, the magnetic flux from the Z field may be guided by the flux guides 133 and 135 into the XY plane along the right side of the sense element and cause the magnetization of sense elements 123 and 125 to rotate in a second direction, opposite from the first direction towards a lower resistance, as these flux guides are located below the sense elements 123, 125. Thus, the sensor 121 can detect the component directions of an applied field along the third axis. Although in the preferred embodiment, the flux guides are in a plane orthogonal to the plane of the field sensor, the flux guides will still function if the angle they make with the sensor is not exactly 90 degrees. In other embodiments, the angle between the flux guide and the field sensor could be in a range from 45 degrees to 135 degrees, with the exact angle chosen depending on other factors such as on the ease of fabrication.

As seen from the foregoing, a magnetic field sensor may be formed from differential sensors 101, 111, 121 which use unshielded sense elements 102-105, 112-115, and sense elements 122-125 with guided magnetic flux connected in a bridge configuration over respective pinned, or reference, layers 106-109, 116-119, and 126-129 to detect the presence and direction of an applied magnetic field. With this configuration, the magnetic field sensor provides good sensitivity, and also provides the temperature compensating properties of a bridge configuration.

The bridge circuits 101, 111, 121 may be manufactured as part of an existing MRAM or thin-film sensor manufacturing process with only minor adjustments to control the magnetic orientation of the various sensor layers and cross section of the flux guiding structures. Each of the pinned layers 106-109, 116-119, and 126-129 may be formed with one or more lower ferromagnetic layers, and each of the sense elements 102-105, 112-125, 122-125 may be formed with one or more upper ferromagnetic layers. An insulating tunneling dielectric layer (not shown) may be disposed between the sense elements 102-105, 112-125, 122-125 and the pinned layers 106-109, 116-119, and 126-129. The pinned and sense electrodes are desirably magnetic materials whose magnetization direction can be aligned. Suitable electrode materials and arrangements of the materials into structures commonly used for electrodes of magnetoresistive random access memory (MRAM) devices and other magnetic tunnel junction (MTJ) sensor devices are well known in the art. For example, pinned layers 106-109, 116-119, and 126-129 may be formed with one or more layers of ferromagnetic and antiferromagnetic materials to a combined thickness in the range 10 to 1000 Å, and in selected embodiments in the range 250 to 350 Å. In an exemplary implementation, each of the pinned layers 106-109, 116-119, and 126-129 is formed with a single ferromagnetic layer and an underlying anti-ferromagnetic pinning layer. In another exemplary implementation, each pinned layer 106-109, 116-119, and 126-129 includes a synthetic anti-ferromagnetic stack component, for example, a stack of Cobalt Iron (CF)/Cobalt Iron Boron (CFB), Ruthenium (Ru), and CFB which is 20 to 80 Å thick, and an underlying anti-ferromagnetic pinning layer that is approximately 200 Å thick. The lower anti-ferromagnetic pinning materials may be re-settable materials, such as IrMn, though other materials, such as plantinum manganese (PtMn), can be used which are not readily re-set at reasonable temperatures. As formed, the pinned layers 106-109, 116-119, and 126-129 function as a fixed or pinned magnetic layer when the direction of its magnetization is pinned in one direction that does not change during normal operating conditions. As disclosed herein, the heating qualities of the materials used to pin the pinned layers 106-109, 116-119, and 126-129 can change the fabrication sequence used to form these layers.

One of each of the sense elements 102-105, 112-125, 122-125 and one of each of the pinned layers 106-109, 116-119, 126-129 form a magnetic tunnel junction (MTJ) sensor. For example, for bridge circuit 121, sense element 122 and pinned layer 126 form an MTJ sensor 141. Likewise, sense element 123 and pinned layer 127 form an MTJ sensor 142, sense element 124 and pinned layer 128 form an MTJ sensor 143, and sense element 125 and pinned layer 129 form an MTJ sensor 144.

The pinned layers 106-109, 116-119, and 126-129 may be formed with a single patterned ferromagnetic layer having a magnetization direction (indicated by the arrow) that aligns along the long-axis of the patterned reference layer(s). However, in other embodiments, the pinned reference layer may be implemented with a synthetic anti-ferromagnetic (SAF) layer which at the micron size scale will align the magnetization of the pinned reference layer along the short axis of the patterned reference layer(s). As will be appreciated, the SAF layer may be implemented in combination with an underlying anti-ferromagnetic pinning layer, though with SAF structures with appropriate geometry and materials that provide sufficiently strong magnetization, the underlying anti-ferromagnetic pinning layer may not be required, thereby providing a simpler fabrication process with cost savings.

The sense elements 102-105, 112-125, 122-125 may be formed with one or more layers of ferromagnetic materials to a thickness in the range 10 to 5000 Å, and in selected embodiments in the range 10 to 60 Å. The upper ferromagnetic materials may be magnetically soft materials, such as NiFe, CoFe, Fe, CFB and the like. In each MTJ sensor, the sense elements 102-105, 112-125, 122-125 function as a sense layer or free magnetic layer because the direction of their magnetization can be deflected by the presence of an external applied field, such as the Earth's magnetic field. As finally formed, sense elements 102-105, 112-125, 122-125 may be formed with a single ferromagnetic layer having a magnetization direction (indicated with the arrows) that aligns along the long-axis of the patterned shapes.

The pinned layers 106-109, 116-119, 126-129 and sense elements 102-105, 112-125, 122-125 may be formed to have different magnetic properties. For example, the pinned layers 106-109, 116-119, 126-129 may be formed with an anti-ferromagnetic film exchange layer coupled to a ferromagnetic film to form layers with a high coercive force and offset hysteresis curves so that their magnetization direction will be pinned in one direction, and hence substantially unaffected by an externally applied magnetic field. In contrast, the sense elements 102-105, 112-125, 122-125 may be formed with a magnetically soft material to provide different magnetization directions having a comparatively low anisotropy and coercive force so that the magnetization direction of the sense electrode may be altered by an externally applied magnetic field. In selected embodiments, the strength of the pinning field is about two orders of magnitude larger than the anisotropy field of the sense electrodes, although different ratios may be used by adjusting the respective magnetic properties of the electrodes using well known techniques to vary their composition.

The pinned layers 106-109, 116-119, 126-129 in the MTJ sensors are formed to have a shape determined magnetization direction in the plane of the pinned layers 106-109, 116-119, 126-129 (identified by the vector arrows for each sensor bridge labeled "Pinning direction" in FIG. 1). As described herein, the magnetization direction for the pinned layers 106-109, 116-119, 126-129 may be obtained using shape anisotropy of the pinned electrodes, in which case the shapes of the pinned layers 106-109, 116-119, 126-129 may each be longer in the pinning direction for a single pinned layer. Alternatively, for a pinned SAF structure, the reference and pinned layers may be shorter along the pinning direction. In particular, the magnetization direction for the pinned layers 106-109, 116-119, 126-129 may be obtained by first heating the shaped pinned layers 106-109, 116-119, 126-129 in the presence of a orienting magnetic field which is oriented non-orthogonally to the axis of longest orientation for the shaped pinned layers 106-109, 116-119, 126-129 such that the applied orienting field includes a field component in the direction of the desired pinning direction for the pinned layers 106-109, 116-119, 126-129. The magnetization directions of the pinned layers are thereby aligned, at least temporarily, in a predetermined direction. However, by appropriately heating the pinned layers during this treatment and removing the orienting field without reducing the heat, the magnetization of the pinned layers relaxes along the desired axis of orientation for the shaped pinned layers 106-109, 116-119, 126-129. Once the magnetization relaxes, the pinned layers can be annealed and/or cooled so that the magnetic field direction of the pinned electrode layers is set in the desired direction for the shaped pinned layers 106-109, 116-119, 126-129.

An example of a device that may be tested using the exemplary embodiments include self-test lines 151, 152 formed parallel to the flux guides 135, 136, respectively, equidistant from the sensors 122, 125. Likewise, self-test lines 153, 154 are formed parallel to the flux guides 133, 138, respectively, equidistant from the sensors 123, 124. The self-test lines 151-154 are a conductive material, for example, copper (Cu) or aluminum (Al). For example, a magnetoresistive sense element 122 is formed over a substrate, the magnetoresistive sense element 122 defining a long axis and a first plane through the long axis, the plane being perpendicular to the substrate. First and second self-test current carrying lines 151, 152 are equidistant from, parallel to, and on opposed sides of, the plane; and a flux guide 136 is adjacent a first edge of the first magnetoresistive sense element 122, wherein a first component of a first magnetic field in the plane of the magnetoresistive sense element 122 created by a first current in a first direction in the first self-test current carrying line 151, and a second component of a second magnetic field in the plane of the sense element 122 created by a second current in a second direction in the second self-test current carrying line 152 cancel one another at the intersection of the first plane and the long axis of the magnetoresistive sense element 122, and the first and second magnetic field components out of the plane of the magnetoresistive sense element 122 are additive at the flux guide 136, and a portion of the out of plane components are guided into the magnetoresistive sense element 122 as a third component.

Figure 3:
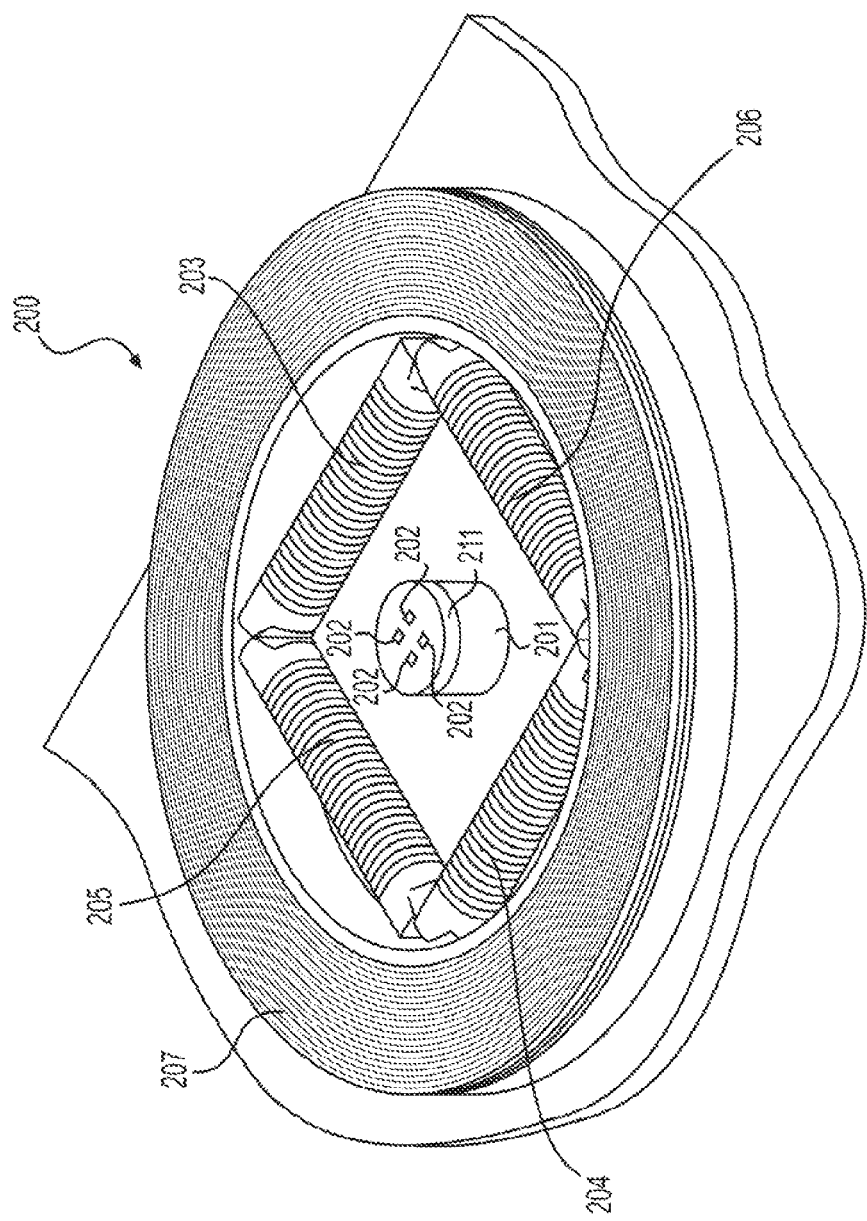
FIG. 3 is a perspective view of the probe board of FIG. 2.
Figure 4:
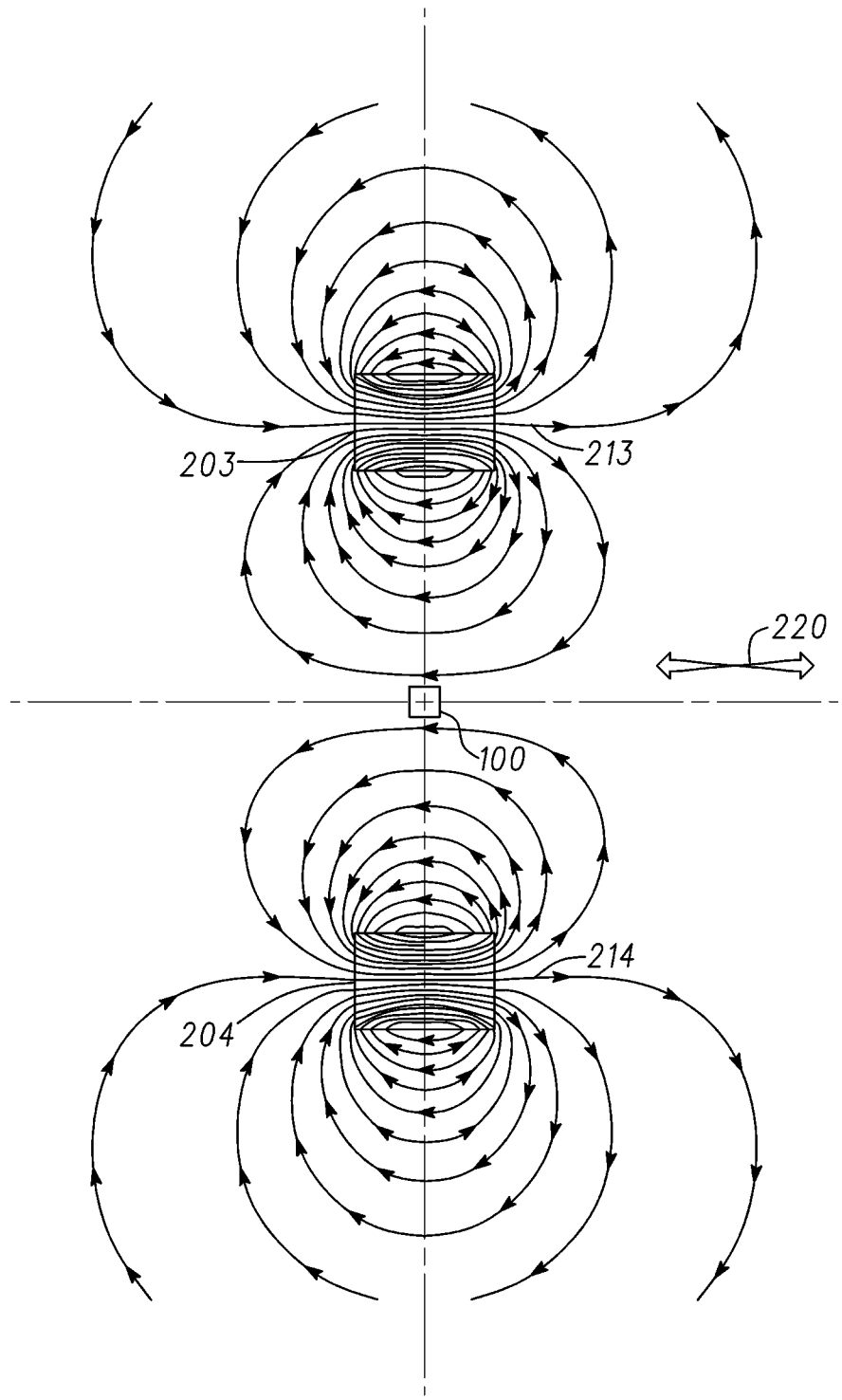
FIG. 4 is a schematic view of a magnetic field generated by a first pair of coils of FIG. 2.

In accordance with an exemplary embodiment for testing the magnetic sensors at wafer level and referring to the pictorial top view, pictorial perspective view, and schematic top view of FIGS. 2-4, respectively, a probe card 200 is provided having one or more probe tips 202 having a first pair 203, 204 of solenoid coils in a non-coaxial arrangement, parallel in configuration on first opposed sides of the probe tips 202, a second pair 205, 206 of solenoid coils in a non-coaxial arrangement, parallel in configuration on second opposed sides of the probe tips 202, and optionally a third solenoid coil 207 either encircling (surrounding) or within (or inscribed in) the first and second pair of coils 203-206. The solenoid coils 203-206 each have an aspect ratio of length to diameter greater than three and the solenoid coil 207 has a low aspect ratio of length to diameter of much less than 1, and is positioned close to the wafer surface. Each coil 203-207 is a conductor, e.g., a copper wire, wound around a non-ferromagnetic core, and is coupled to the PCB to receive a current for creating a magnetic field. Each of the pairs of coils 203, 204 and 205, 206 are spaced apart by about 3.0 to 10.0 cm, but preferably about 5.0 cm. Preferably, a distance between the first and second coils 203, 204 is greater than the length of the coils 203, 204. Likewise, a distance between the third and fourth coils 205, 206 is greater than the length of the coils 205, 206.

The probe card 200 may be any type of structure that supports the solenoid coils 203-207, but preferably is a printed circuit board (PCB). The PCB typically includes a plurality of dielectric insulating layers laminated together with epoxy resin prepreg (reinforcement material pre-impregnated with a resin matrix) that allows for the positioning and coupling of a plurality of electronic components, for example, circuitry 212. After the printed circuit board (PCB) is completed, electronic components must be attached to form a functional printed circuit assembly, or PCA (sometimes called a "printed circuit board assembly" PCBA). In through-hole construction, component leads are inserted in holes. In surface-mount construction, the components are placed on pads or lands on the outer surfaces of the PCB. In both kinds of construction, component leads are electrically and mechanically fixed to the board with a molten metal solder. The coils 203-207 are placed on the PCB using surface-mount construction in the preferred embodiment.

A spacer, or nest, 201 is positioned on the probe card 200 and within the coils 203-207. In operation, the probe card 200 containing one or more of the probe tips 202 is placed over an integrated circuit of the magnetic sensor 100 or a plurality of magnetic sensors 100. The spacer 201 prevents the coils from touching the magnetic sensors 100 and provides an avenue for a plurality of conductors 209 coupled between the magnetic sensors 100 via probe tips 202, and sensing circuitry 212, which ultimately connect back to test system resources and a control computer for data acquisition. Additional circuitry may also be included on the probe card 200, for example, a test socket (not shown) that is configured to receive a packaged test chip, or circuitry that is configured to amplify, filter, phase lock, or phase measure. The probe ring 211 has a plurality of probe tips 202 positioned for coupling to the nodes of the sensors 101, 111, 121, for example, input nodes 161, 162 and output nodes 163, 164 of sensor 111. The probe tips 202 apply a voltage to, for example the input nodes 161, 162, while sensing the voltage across the sensor elements 112, 113, 115, 118, for example at output nodes 163, 164. The bottom of coils 203-207 and the plane of the magnetic sensor 100 are very close in the Z dimension, preferably about 0.1 cm apart, to properly align the magnetic fields with the magnetic sensor 100. The conductors 209 provide an input to, and receive an output from, the magnetic sensors 100 during wafer level testing.

FIG. 4 is a schematic view of the pair of coils 203, 204 and the magnetic fields 213 and 214, respectively, produced in the horizontal (X) direction 220 through the magnetic sensor 100

Figure 5:
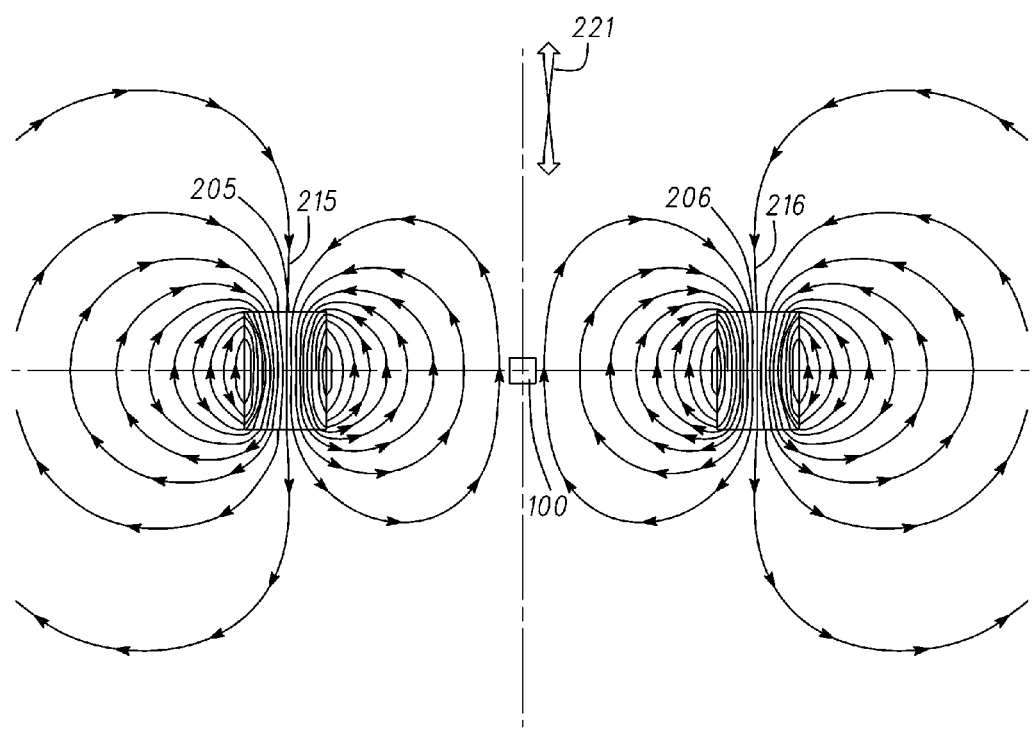
FIG. 5 is a schematic view of a magnetic field generated by a second pair of coils of FIG. 2.

(FIG. 1) when a current is applied to the coils 203, 204. Likewise, FIG. 5 is a schematic view of the pair of coils 205, 206 and the magnetic fields 215 and 216, respectively, produced in the vertical (Y) direction 221 through the magnetic sensor 100 when a current is applied to the coils 205, 206. Note the horizontal (X) direction 220 is orthogonal to the vertical (Y) direction 221. The magnetic fields 213, 214, 215, 216 are configured to be aligned with sensitivity axes 120, 110 of the sensors 101, 111. For example, the magnetic fields 213, 214 could be aligned with the X sense axis, 110 while the magnetic fields 215, 216 would be aligned with the Y sense axis 120.

In the exemplary embodiment, the coils are not coaxial, but rather are separated by a distance that is perpendicular to a line drawn through their centers so that the field applied at the tested device is reversed in direction from the field created at the solenoid core. The pairs of coils add constructively, so it is the field projected by the solenoids as the flux lines close upon themselves that create the field at the magnetic sensor. This is in contrast to a Helmholtz geometry wherein coil sets are coaxial with one another and the device under test is located mid way between them along the shared center line. This primary reason for this geometrical arrangement is the high uniformity in field strength and the angle of the applied field with respect to a perturbation around the design center, given the constraint that no part of the coils may extend below the plane of the wafer. This is especially important for multisite testing wherein an array of devices may be tested at once, and, due to their spatial separation, they may not all experience identical fields if the spatial variation of the field is at all significant. The drawback to this geometry is that the applied field may not be as high as possible for a given applied current, but if careful calculations are taken in the design sufficient field may be applied to test a typical three axis sensor over its entire linear field range. Since the coils are long in aspect ratio (L/W) greater than at least 2, the out of plane component from the coil set is small compared to the in plane component, and therefore the total field at the device under test is dominated by its in-plane component. More importantly, this out of plane component is very weakly dependent on the exact spatial positioning of the device.

Figure 6:
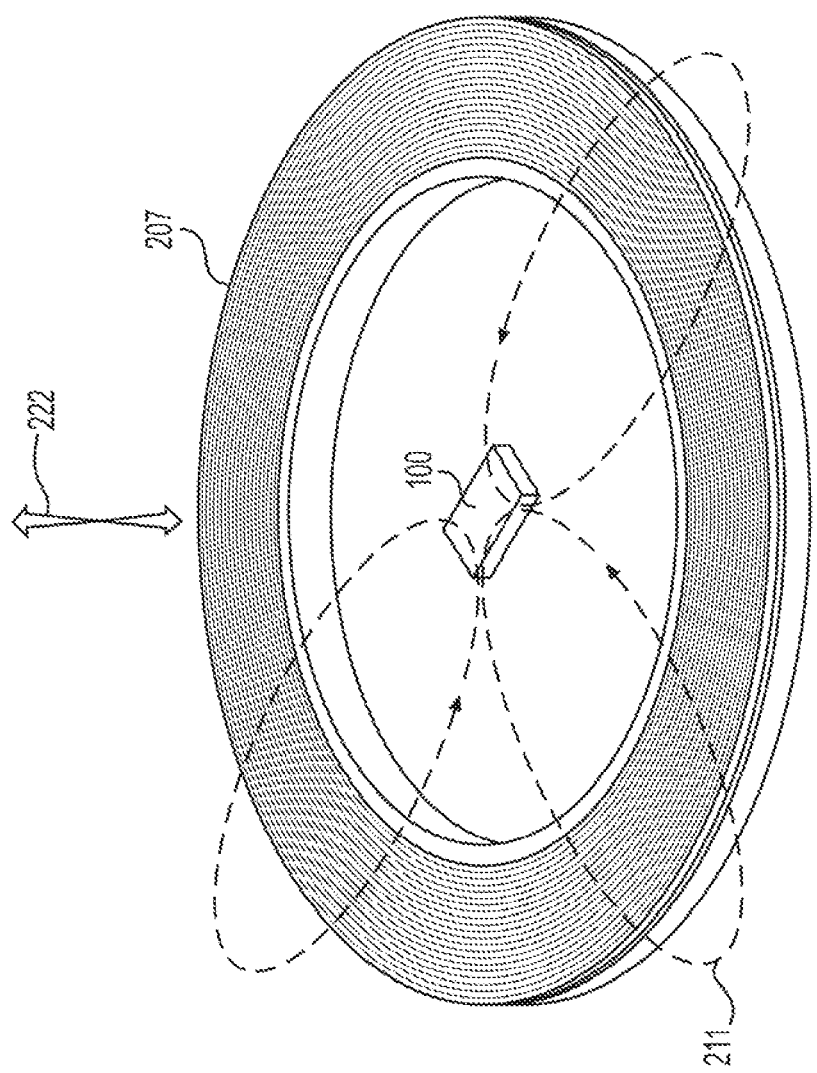
FIG. 6 is a schematic view of a magnetic field generated by the third set of coils of FIG. 2.

FIG. 6 is a schematic view of the optional coil 207 and the magnetic field 217 produced in the Z direction 222 through the magnetic sensor 100 when a current is applied to the coil 207. Note the Z direction 222 is orthogonal to each of the horizontal (X) direction 220 and the vertical (Y) direction 221. Currents may be applied to the coils 203, 204; coils 205, 206; and coil 207 simultaneously or separately. While the magnetic fields are illustrated in the conventional positive direction (horizontally to the right, vertically up, and into the page), the currents applied to the coils 203-207 could be reversed resulting in the magnetic fields 213-217 being in the reverse, or conventionally negative, direction.

Figure 7:
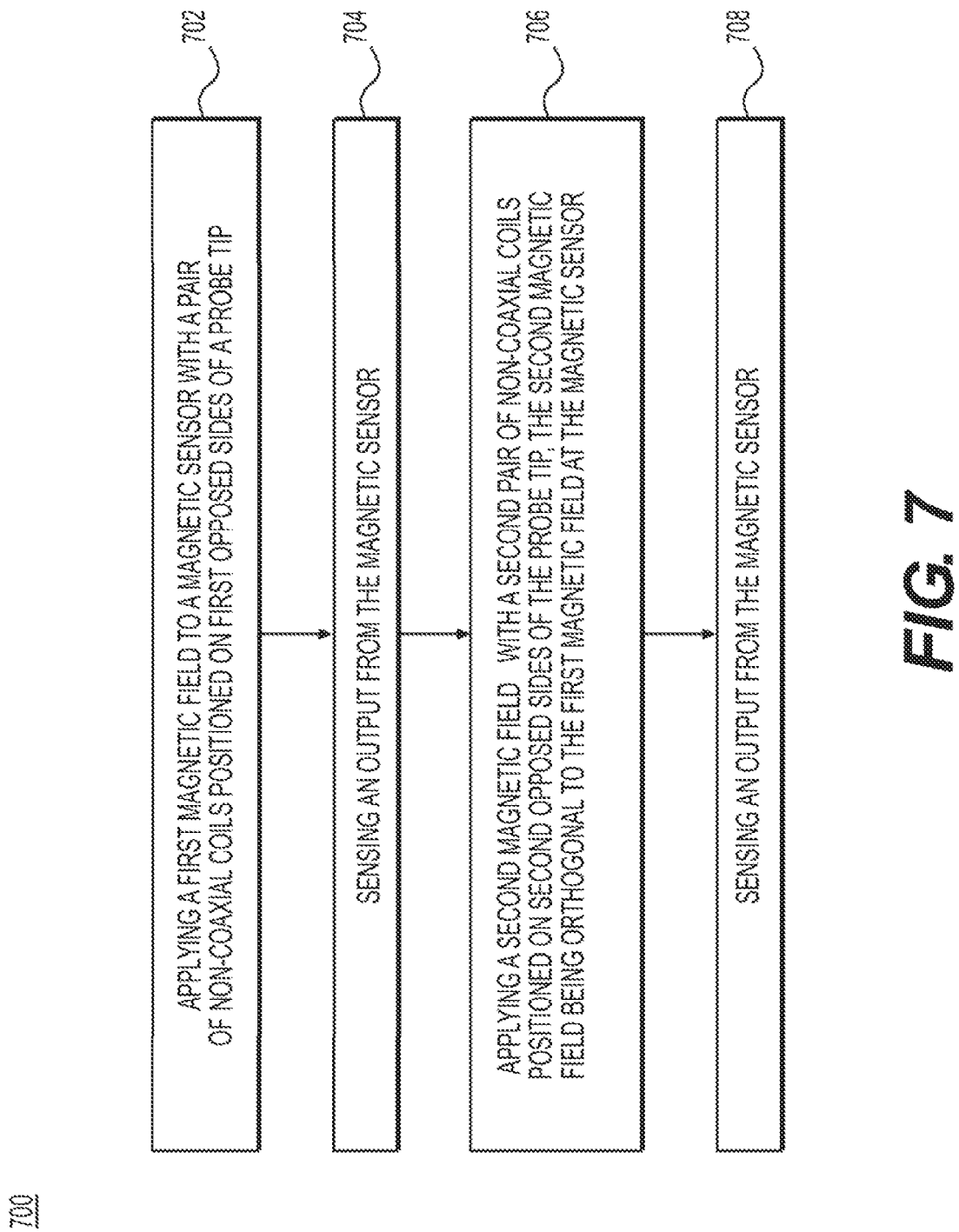
FIG. 7 is a flow chart of an exemplary method for testing magnetic sensors.

FIG. 7 is a flow chart that illustrates an exemplary embodiment of a process 700 suitable for wafer level testing of magnetic sensors. The various tasks performed in connection with process 700 may be performed by software, hardware, firmware, or any combination thereof. For illustrative purposes, the following description of process 700 may refer to elements mentioned above in connection with FIG. 3. In practice, portions of process 700 may be performed by different elements of the described system, e.g., a processor, a display element, or a data communication component. It should be appreciated that process 700 may include any number of additional or alternative tasks, the tasks shown in FIG. 7 need not be performed in the illustrated order, and process 700 may be incorporated into a more comprehensive procedure or process having additional functionality not described in detail herein. Moreover, one or more of the tasks shown in FIG. 7 could be omitted from an embodiment of the process 700 as long as the intended overall functionality remains intact.

Referring to FIG. 7, the method 700 of testing a magnetic sensor with a probe card of the type including a plurality of probe tips and first and second pairs of non-coaxial coils, comprises applying 702 a first magnetic field to the magnetic sensor with the first pair of non-coaxial coils positioned on first opposed sides of the probe tip; sensing 704 an output from the magnetic sensor; applying 706 a second magnetic field with the second pair of non-coaxial coils positioned on second opposed sides of the probe tip, the second magnetic field being orthogonal to the first magnetic field at the magnetic sensor; and sensing 708 an output from the magnetic sensor. The sensing steps may occur simultaneously or sequentially.

Although the described exemplary embodiments disclosed herein are directed to probe cards and methods for using same, the present invention is not necessarily limited to the exemplary embodiments which illustrate inventive aspects of the present invention. Thus, the particular embodiments disclosed above are illustrative only and should not be taken as limitations upon the present invention, as the invention may be modified and practiced in different but equivalent manners apparent to those skilled in the art having the benefit of the teachings herein. For example, the distances and thickness of the described coils may deviate from the disclosed values. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A probe card for testing a magnetic sensor including a plurality of input nodes and a plurality of output nodes, the probe card comprising:

a probe ring comprising a plurality of probe tips configured to be applied to the input and output nodes;

first and second solenoid coils in a non-coaxial arrangement at first and second opposed sides of the probe ring and configured to create a first and a second magnetic field, respectively; and third and fourth solenoid coils in a non-coaxial arrangement at third and fourth opposed sides of the probe ring and configured to create a third and a fourth magnetic field, respectively, the third and fourth magnetic fields being orthogonal to the first and second magnetic fields.

2. The probe card of claim 1 further comprising:

a fifth solenoid coil having a low aspect ratio of length to diameter positioned adjacent the surface of the sensor to be measured and the first, second, third, and fourth solenoid coils, and configured to create a fifth magnetic field, wherein the fifth magnetic field is orthogonal to each of the first, second, third, and fourth magnetic fields.

3. The probe card of claim 2 wherein the fifth solenoid coil surrounds the first, second, third, and fourth solenoid coils.

4. The probe card of claim 2 wherein the fifth solenoid coil surrounds the probe ring within the first, second, third, and fourth solenoid coils.

5. The probe card of claim 1 wherein the magnetic sensor comprises a first sense axis and a second sense axis orthogonal to the first sense axis, and wherein the fields of the first and second magnetic fields are aligned with the first sense axis, and the third and fourth magnetic fields are aligned with the second sense axis.

6. The probe card of claim 1 wherein the first, second, third, and fourth coils each have an aspect ratio of length to diameter greater than three.

7. The probe card of claim 1 wherein a distance between each of the first and second solenoid coils, and the third and fourth solenoid coils, is greater than the length of the coils.

8. The probe card of claim 1 wherein each of the first and second solenoid coils, and the third and fourth solenoid coils, are configured to provide a highly uniform field in angle and strength, such that for displacements of two millimeters from a center point, the field angle deviates by less than one degree, and the field magnitude differs by less than one percent.

9. The probe card of claim 1 further comprising:

sensing circuitry coupled to the probe tips and configured to be electrically coupled to the sensor nodes for receiving an output from the magnetic sensor in response to at least one of current and voltage inputs provided to the input nodes, and a magnetic field applied to the sensor by the coils.

10. The probe card of claim 9 wherein the sensing circuitry further comprises:

additional circuitry configured to, at least one of the group selected from, amplify, filter, phase lock, or phase measure.

11. The probe card of claim 1 wherein each of the first, second, third, and fourth solenoid coils include a longitudinal axis, wherein the longitudinal axis of the first solenoid coil and the longitudinal axis of the third solenoid coil are disposed orthogonally to one another, and wherein the longitudinal axis of the second solenoid coil and the longitudinal axis of the fourth solenoid coil are disposed orthogonally to one another.

12. The probe card of claim 1 wherein each of the first, second, third, and fourth solenoid coils include a longitudinal axis, wherein the longitudinal axis of the first solenoid coil and the longitudinal axis of the third solenoid coil are disposed perpendicularly to one another, and wherein the longitudinal axis of the second solenoid coil and the longitudinal axis of the fourth solenoid coil are disposed perpendicularly to one another.

13. A test fixture for testing a magnetic sensor, the fixture comprising:

a plurality of electrical contacts disposed on a spacer, and configured to be applied to input and output nodes;

first and second solenoid coils in a non-coaxial arrangement at first and second opposed sides of the spacer, and configured to create a first and a second magnetic field, respectively; and third and fourth solenoid coils in a non-coaxial arrangement at third and fourth opposed side of the spacer, and configured to create a third and a fourth magnetic field, respectively, the third and fourth magnetic fields being orthogonal to the first and second magnetic fields.

14. The test fixture of claim 13 further comprising:

a fifth solenoid coil having a low aspect ratio of length to diameter positioned adjacent to the surface of the sensor to be measured and adjacent the first and second solenoid coils and configured to create a fifth magnetic field, wherein the fifth magnetic field is orthogonal to each of the first, second, third, and fourth magnetic fields.

15. The test fixture of claim 13 further comprising:

a test socket coupled to the electrical contacts, the first and second solenoid coils, the third and fourth solenoid coils, and configured to receive a packaged test chip.

16. The test fixture of claim 13 wherein the fields of the first and second magnetic fields are substantially aligned with a first sense axis of the magnetic sensor, and the third and fourth magnetic fields are aligned with a second sense axis orthogonal to the first sense axis.

17. The test fixture of claim 13 wherein the magnetic sensor comprises input and output nodes, the test fixture further comprising:

sensing circuitry coupled to the probe tips and configured to be electrically coupled to the output nodes for receiving an output from the magnetic sensor in response to at least one of current and a voltage provided at the input nodes, and a magnetic field applied to the sensor by the coils.

18. The test fixture of claim 17 wherein the sensing circuitry further comprises:

additional circuitry configured to, consisting of at least one of the group selected from, amplify, filter, phase lock, or phase measure.

19. The test fixture of claim 13 wherein each of the first, second, third, and fourth solenoid coils include a longitudinal axis, wherein the longitudinal axis of the first solenoid coil and the longitudinal axis of the third solenoid coil are disposed orthogonally to one another, and wherein the longitudinal axis of the second solenoid coil and the longitudinal axis of the fourth solenoid coil are disposed orthogonally to one another.

20. The test fixture of claim 13 wherein each of the first, second, third, and fourth solenoid coils include a longitudinal axis, wherein the longitudinal axis of the first solenoid coil and the longitudinal axis of the third solenoid coil are disposed perpendicularly to one another, and wherein the longitudinal axis of the second solenoid coil and the longitudinal axis of the fourth solenoid coil are disposed perpendicularly to one another.

* * * * *